United States Patent
Tanaka et al.

(10) Patent No.: US 7,301,274 B2
(45) Date of Patent: Nov. 27, 2007

(54) ORGANIC LIGHT EMITTING DIODE DISPLAY WITH INSULATING FILM WHICH CONTAINS SIO

(75) Inventors: Jun Tanaka, Kawasaki (JP); Kiyoshi Ogata, Tokyo (JP); Masaya Adachi, Hitachi (JP); Miharu Otani, Yokohama (JP)

(73) Assignee: Hitachi Displays, Ltd., Chiba-ken (JP)

( * ) Notice: Subject to any disclaimer, the term of this patent is extended or adjusted under 35 U.S.C. 154(b) by 328 days.

(21) Appl. No.: 10/898,593

(22) Filed: Jul. 26, 2004

(65) Prior Publication Data

US 2005/0156520 A1 Jul. 21, 2005

(30) Foreign Application Priority Data

Jan. 19, 2004 (JP) .............................. 2004-010565

(51) Int. Cl.
*H05B 33/00* (2006.01)
(52) U.S. Cl. ...................................... 313/504; 313/512
(58) Field of Classification Search ......... 313/502–512
See application file for complete search history.

(56) References Cited

FOREIGN PATENT DOCUMENTS

| JP | 2001-202827 | 3/2000 |
| JP | 2003-68472 | 8/2001 |
| JP | 2003-195775 | 12/2001 |
| JP | 2003-324201 | 5/2002 |

OTHER PUBLICATIONS

T. Nakayama et al., "Application of Low Refractive Material for Optical Windows of Displays", IDW 2002, pp. 1163-1166, no month.
M. Lu et al., "External Coupling Efficiency in Planar Organic Light Emitting Devices", Applied Physics Letters, vol. 78, No. 13, Mar. 26, 2001, pp. 1927-1929.

*Primary Examiner*—Joseph Williams
(74) *Attorney, Agent, or Firm*—Reed Smith LLP; Stanley P. Fisher, Esq.; Juan Carlos A. Marquez, Esq.

(57) ABSTRACT

An active matrix type organic light emitting diode display serving as a bottom emission type device coupling out emission of an organic electroluminescence layer from a substrate where thin film transistors are formed or as a top emission type device coupling out the emission on the opposite side to the substrate. In a suitable layer (102, 106, 107) in each device, an insulating film containing SiO is formed. The insulating film is porous with nano pores in the film. The porous insulating film is controlled as to film density, film refractive index, nano pore diameter in film, average nano pore diameter in film and maximum nano pore diameter in film so that the refractive index is lower than that of a transparent electrode or a transparent substrate of the display holding the organic electroluminescence layer therebetween, and nano pores are present in the film. Light scattering effect can be obtained so that emission from the organic electroluminescence layer (110) can be coupled out to the outside efficiently.

23 Claims, 3 Drawing Sheets

ORGANIC LIGHT EMITTING DIODE DISPLAY WITH INSULATING FILM WHICH CONTAINS SIO

BACKGROUND OF THE INVENTION

The present invention relates to an active matrix type organic light emitting diode display, and particularly relates to a high-performance active matrix type organic light emitting diode display in which the coupling-out efficiency of emission from an organic electroluminescence layer is improved, and a method for manufacturing the same.

An organic light emitting diode (hereinafter referred to as "OLED") display is a self-emitting device different from a liquid crystal display needing a backlight. Accordingly, the OLED display is characterized in that it is thin in profile, wide in viewing angle, high in response speed and hence excellent in movie display in comparison with the liquid crystal display. In recent years, OLED displays have been researched and developed actively, and announcements of product planning have been made extensively.

A fundamental structure of an OLED display is a sandwich structure in which an OLED emission layer is sandwiched between two electrodes. In this event, the electrode serving to couple out the light of the emission layer to the outside has to be transparent.

Active matrix type OLED displays are classified into bottom emission type devices in which light is coupled out on the transparent substrate side where a pixel circuit is formed, and top emission type devices in which emission is coupled out on the opposite side to a transparent substrate where a pixel circuit is formed, in order to avoid restriction on the open area ratio due to light shielding of the pixel circuit.

In the bottom emission type devices, the electrode holding the OLED emission layer on the substrate side where the pixel circuit is formed is a transparent electrode. In the top emission type devices, the electrode holding the OLED emission layer on the opposite side to the substrate where the pixel circuit is formed is a transparent electrode. Known materials of the transparent electrodes include Indium Tin Oxide materials and Indium Zinc Oxide materials which are also used as transparent electrodes in liquid crystal displays.

In the active matrix type OLED displays serving as bottom emission type devices, glass such as non-alkali glass is often used on the transparent substrate side where a pixel circuit is formed. In this event, according to understanding of classical optics, it is believed (for example, seethe following Non-Patent Document 1) that about 80% of light generated in an OLED emission layer is confined in a substrate due to the total reflection angle between the glass and the air, so that only about 20% of the light can be coupled out to the atmosphere. Even when the luminous efficiency of the OLED emission layer is improved to enhance the luminance, there will be a problem in the coupling-out efficiency of emission to the outside of the substrate such that the display performance cannot be improved.

As means to solve such a problem, there has been proposed a technique in which the coupling-out efficiency can be improved by using a transparent electrode substrate having a low-refractive body made from silica aerogel lower in refractive index than a glass substrate as disclosed in the following Patent Document 1. In addition, there has been proposed a technique in which the coupling-out efficiency can be improved by forming a film of spin-on-glass materials having nano pores in the film and having a lower refractive index than a glass substrate (see the following Non-Patent Document 2). The following Patent Document 2 also discloses that a low-refractive layer is provided. Patent Document 2 says it is preferable that the density of the low-refractive layer is especially not higher than 0.4 g/cm$^3$.

[Patent Document 1] JP-A-2001-202827
[Patent Document 2] JP-A-2003-195775
[Non-Patent Document 1] M. -H. Lu, Appl. Phys. Lett., v78, p1927 (2001)
[Non-Patent Document 2] T. Nakayama, et al., International Display Workshops 2002 (IDW' 02) proceedings. p1163 (2002)

SUMMARY OF THE INVENTION

To apply the aforementioned background-art techniques to active matrix type OLED displays, there are problems as follows.

In the technique disclosed in Patent Document 1, a low-refractive body made from silica aerogel and a transparent electrode contacting with the refractive body are formed directly on a transparent substrate. Such a structure is built because the coupling-out efficiency of emission cannot be fundamentally improved if there is no contact between the low-refractive body and the transparent electrode.

However, in any active matrix type OLED display serving as a bottom emission type device, there is a thin film transistor circuit layer between an electroluminescence layer and a transparent substrate. It is therefore necessary to form the low-refractive body in contact with an anode electrode of the EL layer. In this case, an aperture for connecting the anode electrode and the thin film transistor circuit layer therethrough has to be formed in the low-refractive body layer.

Patent Document 1 shows the condition of 500-600° C. as an example of the temperature with which the low-refractive body made from silica aerogel is formed. It can be, however, noted that the thin film transistor circuit cannot withstand the temperature. An embodiment shows an example in which the low-refractive body is formed at a low temperature of 80° C. in a high pressure vessel in a supercritical dehydration method. However, this is also unclear as to whether the thin film transistor circuit can withstand the high pressure or not.

The technique disclosed in Non-Patent Document 2 also shows an example in which a low-refractive film is formed out of a special material between a transparent substrate and a transparent electrode.

Patent Document 2 says that a silicon oxide film having porosity is an example of the low-refractive layer, and it is preferable that the density of the silicon oxide film is not higher than 0.4 g/cm$^3$. To reduce the refractive index, it is necessary to reduce the film density, but the physical property of the film is also lowered. When the density is not higher than 0.4 g/cm$^3$, the physical property of the film is so low that there occurs a problem in strength when it is applied to an interlayer insulator in an active matrix type OLED display.

Further, Patent Document 2 says that examples of materials of the low-refractive layer include silica aerogel, polymeric bonding agents, magnesium fluoride, inorganic particulates including microvoids, organic particulates, etc. It is, however, difficult to say those are applicable materials because the process for manufacturing an active matrix type OLED display includes a step of producing semiconductors.

It is an object of the present invention to solve the problems in the background-art techniques. It is another object of the present invention to provide an active matrix type OLED display in which thin film transistors are formed on a substrate, and emission from an organic electroluminescence layer can be coupled out on the transparent substrate side efficiently, and a method for manufacturing the same.

In an active matrix type OLED display (a bottom emission type device or a top emission type device), a porous insulating film containing silicon oxide (SiO) efficient in coupling out emission is formed in an optical path on the side where emission from an organic electroluminescence layer is released to the outside.

The porous insulating film is an insulator having the following properties.

(1) Film Density

The porous insulating film has a feature of the film density not lower than 0.6 g/cm$^3$ and lower than 1.8 g/cm$^3$, more preferably not lower than 0.6 g/cm$^3$ and not higher than 1.5 g/cm$^3$. When the film density is lower than 0.6 g/cm$^3$, the film physical property, particularly the film hardness or the coefficient of elasticity is lowered in correlation with the film density. Thus, it is difficult to say the insulating film is suitable for forming a thin film transistor circuit. On the contrary, when the film density is not lower than 1.8 g/cm$^3$, the insulating film has a structure with nano pores reduced in correlation with the film density. Thus, it is impossible to obtain a porous insulating film intended in the present invention.

(2) Film Refractive Index

The porous insulating film has a feature of the film refractive index not lower than 1.1 and not higher than 1.4. When the refractive index is lower than 1.1, the film density is reduced in correlation therewith. That is, the film physical property such as the film hardness or the coefficient of elasticity is lowered. Thus, it is difficult to say the insulating film is suitable for forming a thin film transistor circuit. On the contrary, when the refractive index is higher than 1.4, the difference from the refractive index of the transparent substrate or the transparent electrode used in the OLED display is so small that the coupling-out efficiency of emission from the organic electroluminescence layer to the outside becomes poor. Thus, it is impossible to obtain an effect intended in the present invention.

(3) Main Diameter of Nano Pores in Film

The porous insulating film according to the present invention has a feature that the main diameter of nano pores in the porous insulating film is not shorter than 0.2 nm and not longer than 5.0 nm, more preferably not shorter than 0.2 nm and not longer than 3.0 nm. When the main diameter of nano pores is shorter than 0.2 nm, the diameter of nano pores is so small that the light scattering effect depending on the nano pores is reduced. As a result, the coupling-out efficiency of emission from the organic electroluminescence layer to the outside becomes poor. Thus, it is impossible to obtain an effect intended in the present invention. When the main diameter of nano pores is much longer than 5.0 nm, the film density is reduced in correlation therewith. That is, the film physical property such as the film hardness or the coefficient of elasticity is lowered. Thus, it is difficult to say the insulating film is suitable for forming a thin film transistor circuit.

(4) Average Diameter of Nano Pores in Film

The porous insulating film according to the present invention has a feature that the average diameter of nano pores in the porous insulating film is not shorter than 0.6 nm and not longer than 3.0 nm. When the average diameter of nano pores is shorter than 0.6 nm, the diameter of nano pores is so small that the light scattering effect depending on the nano pores is reduced. As a result, the coupling-out efficiency of emission from the organic electroluminescence layer to the outside becomes poor. Thus, it is impossible to obtain an effect intended in the present invention. When the average diameter of nano pores is much longer than 3.0 nm, the film density is reduced in correlation therewith. That is, the film physical property such as the film hardness or the coefficient of elasticity is lowered. Thus, it is difficult to say the insulating film is suitable for forming a thin film transistor circuit.

(5) Maximal Diameter of Nano Pores in Film

The porous insulating film according to the present invention has a feature that the maximal diameter of nano pores in the porous insulating film is not shorter than 0.3 nm and shorter than 2.0 nm. When the maximal diameter of nano pores is shorter than 0.3 nm, the diameter of nano pores is so small that the light scattering effect depending on the nano pores is reduced. As a result, the coupling-out efficiency of emission from the organic electroluminescence layer to the outside becomes poor. Thus, it is impossible to obtain an effect intended in the present invention. When the maximal diameter of nano pores is not shorter than 2.0 nm, the film density is reduced in correlation therewith. That is, the film physical property such as the film hardness or the coefficient of elasticity is lowered. Thus, it is difficult to say the insulating film is suitable for forming a thin film transistor circuit.

(6) Film Light Transparency

The porous insulating film according to the present invention has a feature that the light transparency in a visible light wavelength range is 80% or higher, more preferably 90% or higher. When the light transparency is lower than 80%, the light shielding effect surpasses the coupling-out effect of emission. Thus, it is impossible to obtain an effect intended in the present invention.

The porous insulating film having the aforementioned features (1) to (6) is lower in refractive index than the transparent substrate or the transparent electrode used in the OLED display. In addition, the porous insulating film also provides a light scattering effect due to nano pores existing in the film. Accordingly, light emitted from the organic electroluminescence layer is prevented from being confined in the transparent substrate or the transparent electrode so that the emission from the organic electroluminescence layer can be coupled out to the outside efficiently. Thus, the luminance can be improved.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF PREFERRED EMBODIMENTS

Figure 1:
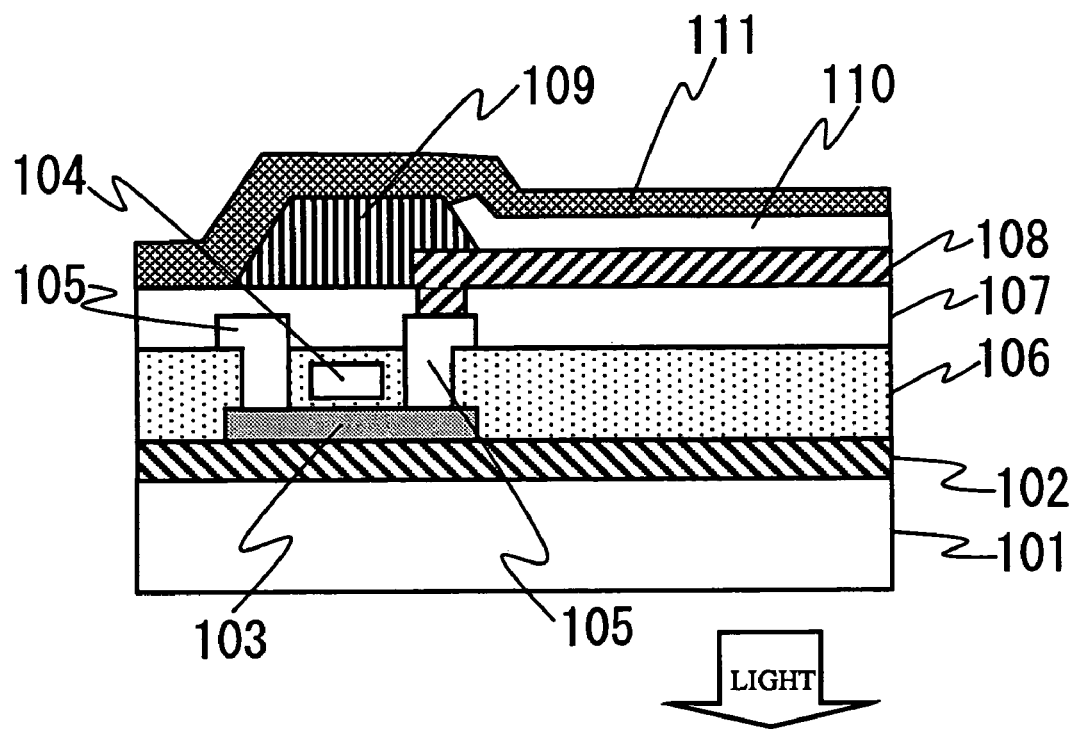
FIG. 1 is a sectional view for explaining an active matrix type OLED display serving as a bottom emission type device according to the present invention.

An embodiment of the present invention will be described below with reference to FIGS. 1, 2 and 3A-3F.

As for a porous insulating film for coupling out emission from an organic electroluminescence layer efficiently, description will be made using the substrate sectional view shown in FIG. 1, about a bottom emission type device which is an example of an active matrix type OLED display having a low-temperature poly-silicon transistor on a substrate.

An undercoat insulator 102 for preventing impurities or moisture from diffusing is formed on a transparent substrate 101. A thin film transistor layer is placed on the undercoat insulator 102. A poly-silicon transistor film 103, a gate insulator (not shown), a gate electrode wiring 104, source/drain electrode wirings 105 connected to the transistor film 103, and an inter-wiring-layer insulator 106 are formed in the thin film transistor layer.

Further, an anode transparent electrode 108 is electrically connected to one of the electrode wirings 105 through a passivation insulator 107. An organic electroluminescence layer 110 is separated by pixel unit through a display portion pixel separating insulating layer 109. A cathode layer 111 is placed on the organic electroluminescence layer 110. When an electric signal from a peripheral transistor circuit is applied between the anode transparent electrode 108 and the cathode layer 111, a current and a voltage are loaded on the organic electroluminescence layer 110.

The cathode layer 111 is an opaque electrode. The cathode layer 111 reflects emitted light at the time of emission of a pixel in the display portion, so as to extract the emitted light from the pixel in the display portion to the transparent substrate 101 side. Thus, the active matrix type OLED display serving as a bottom emission type device can be obtained.

Here, a function of coupling out emission is added to the passivation insulator 107 contacting with the anode transparent electrode 108 on which the organic electroluminescence layer 110 is formed. This function can be attained by the passivation insulator 107 as follows. That is, the passivation insulator 107 is a porous insulating film which is porous with nano pores in the film and contains silicon oxide (SiO). The porous insulating film 107 is characterized in that the film density thereof is not lower than 0.6 g/cm$^3$ and lower than 1.8 g/cm$^3$, and the film refractive index is lower than that of the anode transparent electrode 108.

In addition, the inter-wiring-layer insulator 106 formed between the passivation insulator 107 and the undercoat insulator 102 may be formed as a porous insulating film which is porous with nano pores in the film and contains silicon oxide (SiO). The inter-wiring-layer insulator 106 may be a porous insulating film characterized in that the film density thereof is not lower than 0.6 g/cm$^3$ and lower than 1.8 g/cm$^3$, and the film refractive index is lower than that of the anode transparent electrode 108.

Further, the undercoat insulator 102 may be formed as a porous insulating film which is porous with nano pores in the film and contains silicon oxide (SiO). The undercoat insulator 102 may be a porous insulating film characterized in that the film density thereof is not lower than 0.6 g/cm$^3$ and lower than 1.8 g/cm$^3$, and the film refractive index is lower than that of the anode transparent electrode 108.

Incidentally, the porous insulating film has the aforementioned features (2) to (6). The porous insulating film having these features is excellent in film physical property.

A method for manufacturing the porous insulating film will be described below.

The porous insulating film which is porous with nano pores in the film and contains SiO and in which the film density thereof is not lower than 0.6 g/cm$^3$ and lower than 1.8 g/cm$^3$, is obtained by heating a coat film containing a hydrogen silsesquioxane compound or a methyl silsesquioxane compound as its chief component.

An application solution containing a hydrogen silsesquioxane compound or a methyl silsesquioxane compound as its chief component is applied onto a substrate, intermediately heated at a temperature not lower than 100° C. and lower than 300° C., and then heated in the condition of a temperature not lower than 300° C. and not higher than 450° C. in an inert atmosphere such as a nitrogen atmosphere. Thus, Si—O—Si bonds are formed like a ladder structure, and finally formed into an insulating film containing SiO as its chief component.

The maximum temperature to form the insulating film is in a range not lower than 300° C. and not higher than 450° C. Accordingly, when a thin film transistor is formed chiefly out of poly-crystalline silicon in the active matrix type OLED display, the heating step temperature can be reduced to 450° C. or lower. The insulating film is therefore advantageous in that the insulating film gives no failure in property to the thin film transistor due to the influence of heating.

In the insulating film containing SiO as its chief component and obtained by heating a coat film containing a hydrogen silsesquioxane compound or a methyl silsesquioxane compound as its chief component, the silsesquioxane compound solution is prepared to contain a component easy to decompose at a temperature lower than the final heating temperature, that is, lower than 300° C., as well as a solvent such as methyl isobutyl ketone. Each site where this component has decomposed in the film is formed as a nano pore. When the nano pore formation is controlled by changing the decomposition behavior based on the temperature with which the film is formed, the range of the diameter of nano pores can be put in a selective range shown in the features (3) to (5).

When the diameter of the nano pores increases, there occurs a new problem that the mechanical strength of the insulating film itself as a structure is lowered, or a leak current flowing in the insulating film increases so that the insulation withstand voltage characteristic of the insulating film is lowered. It is therefore necessary to pay close attention to the size of nano pores included in the insulating film. For this reason, according to the present invention, the range of the diameter of nano pores is controlled as shown in the aforementioned features (3) to (5) so that the lowering of the mechanical strength or the insulation withstand voltage of the insulating film is suppressed.

Examples of methods for applying the solution include a rotation application method, a slit application method and a printing method. The insulating film is formed by heating the coat film. Therefore, when minute wiring is formed with a high density, the insulating film is more advantageous than a CVD film because the property of coating steps is so excellent that the surface steps can be dissolved.

Recently, it has been prevailing that large-sized glass substrates, for example, substrates measuring 730 mm by 930 mm or 1,000 mm by 1,200 mm or larger substrates are used in a line for manufacturing thin film transistors of active matrix type OLED displays. A porous insulating film, which is porous with nano pores in the film and contains SiO and which is characterized by a film density not lower than 0.6 g/cm$^3$ and lower than 1.8 g/cm$^3$, is formed on such a large-sized substrate by an application/heating system. According to this method, the equipment cost can be reduced on a large scale so that there is a great effect that the investment cost of the manufacturing line and the element cost can be suppressed.

According to another method for manufacturing a porous insulating film, a porous insulating film which is porous with nano pores in the film and contains SiO and which is characterized by a film density not lower than 0.6 g/cm$^3$ and lower than 1.8 g/cm$^3$, is formed in a chemical vapor deposition (CVD) method using source gas containing alkylsilane compounds or alkoxysilane compounds as its chief component.

Preferable examples of the alkylsilane compounds to be used here include trimethylsilane, triethylsilane, tetramethylsilane, tetraethylsilane, etc. Preferable examples of the alkoxysilane compounds to be used here include trimethoxysilane, triethoxysilane, tetramethoxysilane, tetraethoxysilane, etc.

A film is formed out of such compounds by chemical vapor deposition reaction using the gas containing alkylsilane compounds or alkoxysilane compounds as its chief component. Heat treatment is applied to the film in the condition of a temperature not lower than 300° C. and lower than 450° C. so as to obtain an insulating film.

When the insulating film is formed in the CVD method, alkylsilane compounds or alkoxysilane compounds are used as the chief component of the source gas so as to finally form the insulating film containing SiO as its chief component in an ECR (Electron Cyclotron Resonance) method, a plasma CVD method or the like.

Also in this case, as a technique for controlling the diameter of nano pores existing in the insulating film, for example, a component high in thermal decomposability is mixed into the source gas, and nano pores are formed in the sites where this component decomposes in the film due to heating at 350-450° C. when the film is formed. In such a technique, the decomposition behavior can be changed by the film formation temperature if a component having a high thermal decomposition temperature is selected from various components. Thus, the nano pore formation is controlled so that the range of the nano pore diameter can be put in a selective range.

Also in this case, when the diameter of the nano pores increases, there occurs a new problem that the mechanical strength of the insulating film itself as a structure is lowered, or a leak current flowing in the insulating film increases so that the insulation withstand voltage characteristic of the insulating film is lowered. It is therefore necessary to pay close attention to the size of nano pores included in the insulating film. For this reason, according to the present invention, the range of the diameter of nano pores is controlled as shown in the aforementioned features (3) to (5) so that the lowering of the mechanical strength or the insulation withstand voltage of the insulating film is suppressed.

Further, also in this case, the maximum temperature to form the insulating film is in a range not lower than 300° C. and not higher than 450° C. Accordingly, when a thin film transistor circuit is formed chiefly out of poly-crystalline silicon in an active matrix type OLED display, the heating step temperature can be reduced to 450° C. or lower. The insulating film is therefore advantageous in that no failure in property is given to the thin film transistor due to the influence of heating.

Incidentally, apertures are formed in the insulating film when thin film transistors are formed therein. In this event, etching gas the same as that when apertures are formed in a silicon oxide film can be used because the porous insulating film which is porous with nano pores in the film and contains SiO and which is characterized by a film density not lower than 0.6 g/cm$^3$ and lower than 1.8 g/cm$^3$, is a film containing SiO as its chief component.

Next, a function of coupling out emission efficiently is added to an active matrix type OLED display serving as a top emission type device in which emission from an organic elecrtoluminescence layer is coupled out from the opposite side to a substrate where thin film transistors are formed. With reference to the substrate sectional view of FIG. 2, description will be made on an active matrix type OLED display serving as a top emission type device having a low-temperature poly-silicon transistor on a substrate by way of example.

In the same manner as in FIG. 1, an undercoat insulator for preventing impurities or moisture from diffusing is placed on the substrate. A thin film transistor layer is placed on the undercoat insulator. A poly-silicon transistor film, a gate insulator (not shown), a gate electrode wiring, source/drain electrode wirings connected to the poly-silicon transistor film, and an inter-wiring-layer insulator are formed in the thin film transistor layer. Further, a passivation film is formed on the inter-wiring-layer insulator so that an organic electroluminescence electrode 201 also serving as a reflection layer for reflecting emission from an organic electroluminescence layer 202 is electrically connected to the source or drain electrode wiring. The organic elecrtoluminescence layer 202 is separated by pixel unit through a display portion pixel separating insulating layer. An organic elecrtoluminescence opposed electrode 203 is placed on the organic electroluminescence layer 202. When an electric signal from a peripheral transistor circuit is applied between the organic elecrtoluminescence electrode 201 and the organic elecrtoluminescence opposed electrode 203, a current and a voltage are loaded on the organic elecrtoluminescence layer 202. The organic elecrtoluminescence opposed electrode 203 is a transparent electrode in a top emission type device, such that emission reflected on the organic elecrtoluminescence electrode 201 when the organic elecrtoluminescence layer 202 makes emission can be also transmitted, and the emission from the organic elecrtoluminescence can be coupled out.

A porous insulating film 204 is formed on the organic elecrtoluminescence opposed electrode 203 so as to provide a function of coupling out emission from the organic elecrtoluminescence layer 202 efficiently. The porous insulating film 204 is porous with nano pores in the film and contains SiO. The porous insulating film 204 is characterized in that the film density thereof is not lower than 0.6 g/cm$^3$ and lower than 1.8 g/cm$^3$, and the refractive index is lower than that of the organic elecrtoluminescence opposed electrode 203.

Next, a protective film 205 preventing permeation of moisture and oxygen and having a good light transparency is formed on the porous insulating film 204. Thus, an active matrix type OLED display serving as a top emission type device is obtained.

In this event, the porous insulating film containing SiO is an insulator having the aforementioned features (2) to (6). The porous insulating film having these features is excellent in film physical property.

A method for manufacturing the porous insulating film will be described below.

In the same manner as in the manufacturing method in FIG. 1, the porous insulating film which is porous with nano pores in the film and contains SiO and in which the film density is not lower than 0.6 g/cm$^3$ and lower than 1.8 g/cm$^3$, is obtained by heating a coat film containing a hydrogen silsesquioxane compound or a methyl silsesquioxane compound as its chief component.

An application solution containing a hydrogen silsesquioxane compound or a methyl silsesquioxane compound as its chief component is applied onto a substrate, and heated in the condition of a temperature not lower than 100° C. and not higher than 250° C. in an inert atmosphere such as a nitrogen atmosphere. Thus, Si—O—Si bonds are formed like a ladder structure, and finally formed into an insulating film containing SiO as its chief component.

In the insulating film containing SiO as its chief component and obtained by heating a coat film containing a hydrogen silsesquioxane compound or a methyl silsesquioxane compound as its chief component, the silsesquioxane compound solution is prepared to contain a component easy to decompose at a temperature lower than the final heating temperature, that is, lower than 250° C., as well as a solvent such as methyl isobutyl ketone. Each site where this component has decomposed in the film is formed as a nano pore. When the nano pore formation is controlled by changing the decomposition behavior based on the temperature with which the film is formed, the range of the diameter of nano pores can be put in a selective range.

In the same manner as in the manufacturing method in FIG. 1, when the diameter of the nano pores increases, there occurs a new problem that the mechanical strength of the insulating film itself as a structure is lowered, or a leak current flowing in the insulating film increases so that the insulation withstand voltage characteristic of the insulating film is lowered. It is therefore necessary to pay close attention to the size of nano pores included in the insulating film. For this reason, according to the present invention, the range of the diameter of nano pores is controlled so that the lowering of the mechanical strength or the insulation withstand voltage of the insulating film is suppressed.

The maximum temperature to form the insulating film is in a range not higher than 250° C. Accordingly, the influence of heating on the substrate having the organic electroluminescence layer formed thereon is suppressed so that no failure in property is given thereto.

The porous insulating film which is porous with nano pores in the film and contains SiO and which is characterized by a film density not lower than 0.6 g/cm$^3$ and lower than 1.8 g/cm$^3$, is formed in a method such as a CVD method using gas containing alkylsilane compounds or alkoxysilane compounds as its chief component.

The alkylsilane compounds or alkoxysilane compounds are used as the chief component of the source gas so as to form a film due to chemical vapor deposition reaction in a method such as an ECR method or a plasma CVD method. After that, the film is subjected to heat treatment in the condition of a temperature not higher than 250° C. so as to finally form the insulating film containing SiO as its chief component.

Also in this case, as a technique for controlling the diameter of nano pores existing in the insulating film, for example, a component high in thermal decomposability is mixed into the source gas, so that nano pores are formed in the sites where this component decomposes in the film due to heating at 250° C. when the film is formed. In such a technique, the decomposition behavior can be changed by the film formation temperature if a component having a high thermal decomposition temperature is selected from various components. Thus, the nano pore formation is controlled so that the range of the nano pore diameter can be put in a selective range.

Also in this case, when the diameter of the nano pores increases, there occurs a new problem that the mechanical strength of the insulating film itself as a structure is lowered, or a leak current flowing in the insulating film increases so that the insulation withstand voltage characteristic of the insulating film is lowered. It is therefore necessary to pay close attention to the size of nano pores included in the insulating film. For this reason, according to the present invention, the range of the diameter of nano pores is controlled so that the lowering of the mechanical strength or the insulation withstand voltage of the insulating film is suppressed.

Further, also in this case, the maximum temperature to form the insulating film is in a range not higher than 250° C. Accordingly, the influence of heating on the substrate having the organic electroluminescence layer formed thereon is suppressed so that no failure in property is given thereto.

Next, the method for manufacturing an active matrix type OLED display serving as a bottom emission type device having a low-temperature poly-silicon transistor on a substrate will be described with reference to the process views of FIGS. 3A-3F. Incidentally, the manufacturing method described below is an example, which places no limit on the present invention.

Figure 3:
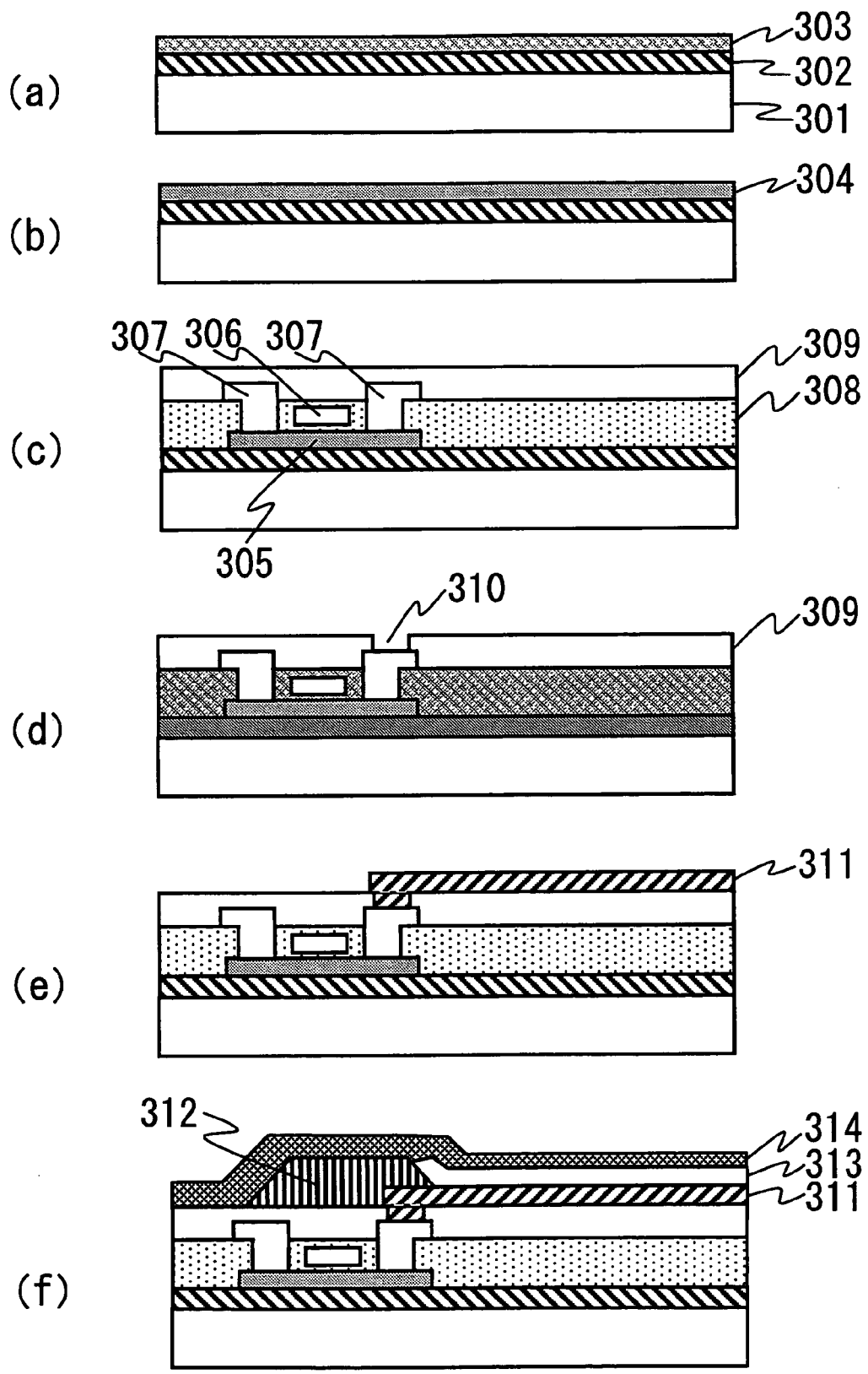
FIGS. 3A-3F are explanatory views of a process for manufacturing an active matrix type OLED display serving as a bottom emission type device according to the present invention.

First, in FIG. 3A, by use of a CVD method, an SiN film serving as a barrier film for preventing impurities and moisture from diffusing from a transparent substrate 301 is formed on the substrate 301 so as to be 100 nm thick, and next an SiO film is formed to be 50 nm thick. Thus, an undercoat insulator 302 is formed to have a total thickness of 150 nm. Next, an amorphous silicon film 303 is formed thereon to be 50 nm thick by a CVD method.

After that, in FIG. 3B, the amorphous silicon film in a portion where a pixel circuit should be formed is reformed into a poly-silicon film 304 by crystallization means using an excimer laser irradiation method.

In FIG. 3C, by use of well-known photolithography technology, the poly-silicon film 304 is etched like an island shape 305 so as to form a pattern of a gate insulator (not shown), a gate electrode wiring 306, an interlayer insulator 308 and source/drain electrode wirings 307. Thus, a predetermined thin film transistor is formed and dispose in the pixel portion. In this event, the interlayer insulator 308 is formed out of an SiO film 400 nm thick by use of a CVD method. Next, a porous insulating film 309 which is porous with nano pores in the film and contains SiO and in which the film density thereof is not lower than 0.6 g/cm$^3$ and lower than 1.8 g/cm$^3$, is formed. In this event, the porous insulating film 309 containing SiO is an insulator having the aforementioned features (2) to (6). The insulating film having these features is excellent in film physical property.

The porous insulating film 309 is manufactured in the same manner as in the method for manufacturing a porous insulating film as described in FIG. 1.

Next, in FIG. 3D, with a photoresist as a mask, a through hole 310 reaching the electrode wiring 307 is formed in the porous insulating film 309 in a dry etching method using $SF_6$ gas, and the photoresist is removed.

Apertures are formed in the insulating film when thin film transistors are formed therein. In this event, etching gas the same as that when apertures are formed in a silicon oxide film can be used because the porous insulating film 309 which is porous with nano pores in the film and contains SiO and which is characterized by a film density not lower than 0.6 g/cm$^3$ and lower than 1.8 g/cm$^3$, is a film containing SiO as its chief component.

Next, in FIG. 3E, an ITO film is formed by a sputtering technique, and patterned by use of well-known photolithography technology. Thus, an anode transparent electrode 311 is formed.

Next, in FIG. 3F, a pixel separating insulator 312 for separating the pixel in the display portion is formed in the peripheral portion of the transparent electrode 311. The pixel separating insulator 312 is formed as follows. That is, an SiN film is formed to be 150 nm thick by a CVD method. With a photoresist as a mask, the SiN film is patterned in a dry etching method using $SF_6$ gas so as to expose the anode transparent electrode 311. Next, the surface of the anode transparent electrode 311 is, for example, subjected to oxygen plasma treatment in a vacuum tank for 2 minutes. Next, a hole transport layer, an emission and electron transport layer and an electron injection layer are formed sequentially and continuously as an organic electroluminescence layer 313. A cathode layer 314 is formed as a film thereon continuously.

A hole transport material for forming the hole transport layer or an electron transport material for forming the emission and electron transport layer is not limited, but can be selected from various materials as will be shown below. It is also possible to adopt a technique in which an electron transport layer and an emission layer are separated and formed out of different materials or a technique in which a dopant is made coexistent in the emission layer in order to adjust the emission intensity or the hue.

Examples of hole transport materials include aromatic mono-, di-, tri- and tetra-polyamine compounds represented by diphenylnathtyldiamine, their derivatives, their polymerization compounds, hydrazone, silanamine, enamine, quinacridone, phosphamine, phenanthridine, benzylphenyl, and styrl compounds. It is also possible to use polymeric materials such as polyvinylcarbazole, polycarbonate, polysilane, polyamide, polyaniline, polyphosphazen, and polymethacrylate containing aromatic amine.

Examples of electron transport materials include 8-hydroxyquinoline aluminum complexes or their derivatives represented by tris (8-quinolinol)-aluminum complex derivatives, derivatives of cyclopentadiene, perynone, oxadiazole, bisstilben, distilpyrazine, pyridine, naphthyridine, triazine, etc., nitrile or p-phenylene compounds, complexes of rare-earth elements, etc.

The organic electroluminescence layer can be also formed out of a material having a function separated from the hole injection layer, the hole transport layer, the emission layer, the electron transport layer and the electron injection layer.

In the aforementioned process, an active matrix type OLED display having a thin film transistor in a pixel portion as shown in FIG. 1 can be formed. As a circuit required for driving the OLED device, an optimum circuit configuration having a combination of transistors may be used. As such a circuit, a low-current driver circuit formed out of a CMOS circuit is recommended by way of example. In addition, steps of ion implantation, activation annealing and so on have to be added halfway in the process for manufacturing the transistor circuit. However, these are well-known techniques.

Finally, the OLED display is connected to a peripheral circuit mounted with a driver LSI for driving the thin film transistor, a control LSI, a power supply LSI and so on. Thus, the OLED display is completed.

Although the aforementioned manufacturing method was explained about a low-molecular type OLED display having an organic electroluminescence layer formed by vacuum deposition, the method is also effective in a so-called polymer type OLED display. In spite of a difference in organic electroluminescence layer material, the present invention can be applied without losing the effectiveness of the present invention.

EXAMPLE 1

An OLED display whose sectional view is shown in FIG. 1 was manufactured in the following conditions. In FIG. 1, the undercoat insulator 102 was formed out of an SiN film 100 nm thick and an SiO film 50 nm thick thereon by a CVD method so as to have a total thickness of 150 nm. The interlayer insulator 106 was formed out of an SiO film 400 nm thick by use of a CVD method. The pixel separating insulator 109 was formed out of an SiN film 150 nm thick by use of a CVD method.

A methyl isobutyl ketone application solution containing a hydrogen silsesquioxane compound as its chief component was applied to a substrate as the insulator 107 contacting with the anode transparent electrode 108. After that, by use of a hot plate heating system, the substrate was heated at 100° C. for 10 minutes, at 150° C. for 10 minutes, at 230° C. for 10 minutes and at 350° C. for 10 minutes in an inert atmosphere such as a nitrogen atmosphere. Thus, Si—O—Si bonds were formed like a ladder structure, and finally formed into a porous insulating film containing SiO as its chief component.

On this occasion, the porous insulating film had the following properties.

Film Thickness: 230 nm, Density: 1.12 g/cm$^3$, Refractive Index: 1.29, Film Hardness: 0.61 GPa, Film Elasticity: 9.17 GPa, Average Nano Pore Diameter in Film: 1.4 nm, Maximum Nano Pore Diameter in Film: 0.6 nm The organic electroluminescence layer 110 and the cathode layer 111 to be formed on the anode transparent electrode 108 were formed as films by use of the following means.

The surface of the anode transparent electrode 108 was subjected to oxygen plasma treatment in a vacuum tank for 2 minutes. Next, a hole transport layer, an emission and electron transport layer and an electron injection layer were formed sequentially and continuously as the organic electroluminescence layer 110. The cathode layer 111 was formed as a film thereon continuously.

The hole transport layer was formed by vacuum deposition of diphenylnathtyldiamine. In this event, a mask for the evaporation was used only in a pixel portion, and heating an evaporation boat was controlled so that the substrate temperature was the room temperature, the degree of vacuum was $10^{-4}$ Pa, and the deposition rate was 0.1 to 1 nm/s. The film thickness was set at 50 nm.

The emission and electron transport layer was formed by vacuum deposition per pixel with tris (8-quinolinol)-aluminum complex derivatives and dopant materials corresponding to the three primary colors R, B and G by use of an mask for the evaporation. Heating an evaporation boat was controlled so that the substrate temperature was the room temperature, the degree of vacuum was $10^{-4}$ Pa, and the deposition rate was 0.1 to 1 nm/s. The film thickness was set at 70 nm.

In this example, a coumarin compound was used as the dopant for G (green) pixels. The electron injection layer was formed by deposition of LiF. Heating a boat was controlled so that the substrate temperature was the room temperature, the degree of vacuum was $10^{-4}$ Pa, and the deposition rate was 0.1 to 1 nm/s. The film thickness was set at 0.5 nm. The cathode layer was formed by deposition of an Al film using a mask for the evaporation all over the pixel area excluding the peripheral portion. Heating a boat was controlled so that the substrate temperature was the room temperature, the degree of vacuum was $10^{-4}$ Pa, and the deposition rate was 0.1 to 1 nm/s. The film thickness was set at 150 nm.

COMPARATIVE EXAMPLE 1

In Example 1, a CVD-formed silicon oxide film using tetraethoxysilane as a raw material was formed (generally referred to as "TEOS film") in place of the porous insulating film 107 contacting with the anode transparent electrode 108. The TEOS film was a well-known silicon oxide film having no nano pore in the film.

On this occasion, the TEOS film had the following properties.

Film Thickness: 230 nm, Density: 2.23 g/cm$^3$, Refractive Index: 1.46

An OLED display was manufactured in the same conditions as in Example 1, except the aforementioned film. The OLED displays in Example 1 and Comparative Example 1 were turned on in the same conditions, and compared as to the intensity of electroluminescence spectrum with respect to a visible light wavelength range, which was coupled out from G pixels to the transparent substrate side. In this event, a coumarin compound was used as the dopant for the G pixels.

The intensity of electroluminescence spectrum was measured by apparatus having a combination of a photonic multichannel spectral analyzer (Hamamatsu Photonics C5967) and a polychrometer (Hamamatsu Photonics C5094).

Figure 4:
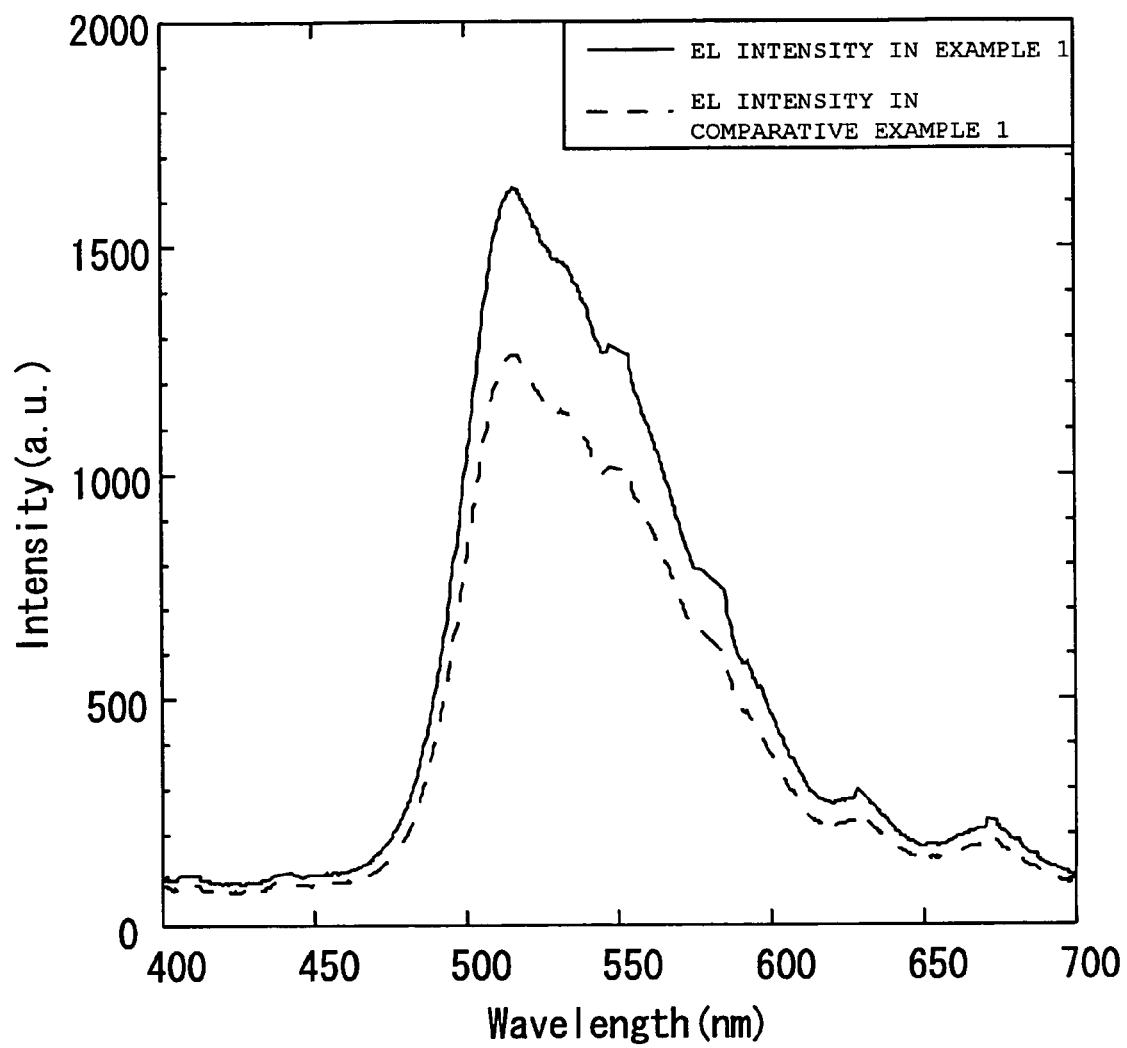
FIG. 4 is a graph showing the intensity of electroluminescence spectrum with respect to a visible light wavelength range measured in an OLED display according to Example 1, compared with that in an OLED display according to Comparative Example 1.

FIG. 4 shows the intensity of electroluminescence spectrum with respect to a visible light wavelength range. From FIG. 4, it is apparent that the EL spectrum measured in the OLED display in Example 1 has higher intensity than that in Comparative Example 1. The two spectra were compared by intensity integration in the visible light wavelength range. Thus, there was obtained a result that the spectrum in Example 1 was about 1.3 times as intensive as that in Comparative Example 1.

As described above, a porous insulating film having features disclosed in the present invention was used as an insulator contacting with an anode transparent electrode having an organic electroluminescence layer formed thereon in an active matrix type OLED display serving as a bottom emission type device. The porous insulating film had a refractive index lower than a transparent electrode or a transparent substrate of the display holding the organic electroluminescence layer therebetween. In addition, nano pores were present in the porous insulating film. As a result, a light scattering effect could be obtained so that the coupling-out efficiency of emission from the organic electroluminescence layer to the transparent substrate side could be improved.

COMPARATIVE EXAMPLE 2

In Example 1, a spin-on-glass material containing a hydrogen silsesquioxane compound as its component was applied in place of the porous insulating film 107 contacting with the anode transparent electrode 108. By use of a hot plate heating system, the substrate was heated at 100° C. for 10 minutes, at 150° C. for 10 minutes, at 230° C. for 10 minutes and at 350° C. for 10 minutes in an inert atmosphere such as a nitrogen atmosphere. Thus, Si—O—Si bonds were formed like a ladder structure, and finally formed into a silicon oxide film having no nano pore in the film.

On this occasion, the silicon oxide film had the following properties.

Film Thickness: 230 nm, Density: 1.52 g/cm$^3$, Refractive Index: 1.46

An OLED display was manufactured in the same conditions as in Example 1, except the aforementioned film. The OLED displays in Example 1 and Comparative Example 2 were turned on in the same conditions, and compared as to the intensity of electroluminescence spectrum with respect to a visible light wavelength range, which was coupled out from G pixels to the transparent substrate side. In this event, a coumarin compound was used as the dopant for the G pixels.

The intensity of electroluminescence spectrum was measured by apparatus having a combination of a photonic multichannel spectral analyzer (Hamamatsu Photonics C5967) and a polychrometer (Hamamatsu Photonics C5094).

The spectra obtained from the displays in Example 1 and Comparative Example 2 were compared by intensity integration in the visible light wavelength range. Thus, there was obtained a result that the spectrum in Example 1 was about 1.3 times as intensive as that in Comparative Example 2.

As described above, a porous insulating film having features disclosed in the present invention was used as an insulator contacting with an anode transparent electrode having an organic electroluminescence layer formed thereon in an active matrix type OLED display serving as a bottom emission type device. The porous insulating film had a refractive index lower than a transparent electrode or a transparent substrate of the display holding the organic electroluminescence layer therebetween. In addition, nano pores were present in the porous insulating film. As a result, a light scattering effect could be obtained so that the coupling-out efficiency of emission from the organic electroluminescence layer to the transparent substrate side could be improved.

EXAMPLE 2

A methyl isobutyl ketone application solution containing a methyl silsesquioxane compound as its chief component was applied to a substrate as the insulator 107 contacting with the anode transparent electrode 108. After that, by use of a hot plate heating system, the substrate was heated at 100° C. for 10 minutes, at 150° C. for 10 minutes, at 230° C. for 10 minutes and at 350° C. for 10 minutes in an inert atmosphere such as a nitrogen atmosphere. Thus, Si—O—Si bonds were formed like a ladder structure, and finally formed into a porous insulating film containing SiO as its chief component.

On this occasion, the porous insulating film had the following properties.

Film Thickness: 230 nm, Density: 1.25 g/cm$^3$, Refractive Index: 1.30, Film Hardness: 4.6 GPa, Film Elasticity: 3.2 GPa, Average Nano Pore Diameter in Film: 2.3 nm An OLED display was manufactured in the same conditions as in Example 1, except the aforementioned film. The OLED display was turned on in the same conditions as the OLED display in Comparative Example 1, and compared therewith as to the intensity of electroluminescence spectrum with respect to a visible light wavelength range, which was coupled out from G pixels to the transparent substrate side. In this event, a coumarin compound was used as the dopant for the G pixels.

The electroluminescence spectra measured in the OLED displays in Example 2 and Comparative Example 1 were compared by intensity integration in the visible light wavelength range. Thus, there was obtained a result that the spectrum in Example 2 was about 1.1 times as intensive as that in Comparative Example 1.

As described above, a porous insulating film having features disclosed in the present invention was used as an insulator contacting with an anode transparent electrode having an organic electroluminescence layer formed thereon in an aactive matrix type OLED display serving as a bottom emission type device. As a result, the coupling-out efficiency of emission from the organic electroluminescence layer to the transparent substrate side could be improved.

EXAMPLE 3

A methyl isobutyl ketone application solution containing a hydrogen silsesquioxane compound different from that in Example 1 as its chief component was applied to a substrate as the insulator 107 contacting with the anode transparent electrode 108. After that, by use of a hot plate heating system, the substrate was heated at 100° C. for 10 minutes, at 150° C. for 10 minutes, at 230° C. for 10 minutes and at 350° C. for 10 minutes in an inert atmosphere such as a nitrogen atmosphere. Thus, Si—O—Si bonds were formed like a ladder structure, and finally formed into a porous insulating film containing SiO as its chief component.

On this occasion, the porous insulating film had the following properties.

Film Thickness: 230 nm, Density: 1.42 g/cm$^3$, Refractive Index: 1.33, Film Hardness: 0.53 GPa, Film Elasticity: 6.7 GPa, Average Nano Pore Diameter in Film: 1.1 nm, Maximum Nano Pore Diameter in Film: 0.64 nm An OLED display was manufactured in the same conditions as in Example 1, except the aforementioned film. The OLED display was turned on in the same conditions as the OLED display in Comparative Example 1, and compared therewith as to the intensity of electroluminescence spectrum with respect to a visible light wavelength range, which was coupled out from G pixels to the transparent substrate side. Thus, there was obtained a result that the spectrum in Example 3 was about 1.2 times as intensive as that in Comparative Example 1.

EXAMPLE 4

In the OLED display shown in FIG. 1 which is a section view, the methyl isobutyl ketone application solution containing a hydrogen silsesquioxane compound as its chief component, which solution was the same as that in Example 1, was applied to the substrate as the interlayer insulator 106. After that, by use of a hot plate heating system, the substrate was heated at 100° C. for 10 minutes, at 150° C. for 10 minutes, at 230° C. for 10 minutes and at 350° C. for 10 minutes in an inert atmosphere such as a nitrogen atmosphere. Thus, Si—O—Si bonds were formed like a ladder structure, and finally formed into a porous insulating film containing SiO as its chief component.

On this occasion, the porous insulating film had the following properties.

Film Thickness: 400 nm, Density: 1.12 g/cm$^3$, Refractive Index: 1.29, Film Hardness: 0.61 GPa, Film Elasticity: 9.17 GPa, Average Nano Pore Diameter in Film: 1.4 nm, Maximum Nano Pore Diameter in Film: 0.6 nm An OLED display was manufactured in the same conditions as in Example 1, except the interlayer insulator 106. The OLED display was turned on in the same conditions as the OLED display in Comparative Example 1, and compared therewith as to the intensity of electroluminescence spectrum with respect to a visible light wavelength range, which was coupled out from G pixels to the transparent substrate side. Thus, there was obtained a result that the spectrum in Example 4 was about 1.3 times as intensive as that in Comparative Example 1.

EXAMPLE 5

In the OLED display shown in FIG. 1 which is a section view, the methyl isobutyl ketone application solution containing a hydrogen silsesquioxane compound as its chief component, which solution was the same as that in Example 1, was applied to the substrate as the insulator 107 contacting with the anode transparent electrode 108, and the interlayer insulator 106. After that, by use of a hot plate heating system, the substrate was heated at 100° C. for 10 minutes, at 150° C. for 10 minutes, at 230° C. for 10 minutes and at 350° C. for 10 minutes in an inert atmosphere such as a nitrogen atmosphere. Thus, Si—O—Si bonds were formed like a ladder structure, and finally formed into a porous insulating film containing SiO as its chief component.

On this occasion, the film thickness of the porous insulating film under the anode transparent electrode reached about 630 nm including the film thickness of the insulator 107 and the film thickness of the interlayer insulator 106. The porous insulating film had the following properties.

Density: 1.12 g/cm$^3$, Refractive Index: 1.29, Film Hardness: 0.61 GPa, Film Elasticity: 9.17 GPa, Average Nano Pore Diameter in Film: 1.4 nm, Maximum Nano Pore Diameter in Film: 0.6 nm An OLED display was manufactured in the same conditions as in Example 1, except the insulator 107 and the interlayer insulator 106. The OLED display was turned on in the same conditions as the OLED display in Comparative Example 1, and compared therewith as to the intensity of electroluminescence spectrum with respect to a visible light wavelength range, which was coupled out from G pixels to the transparent substrate side. Thus, there was obtained a result that the spectrum in Example 5 was about 1.3 times as intensive as that in Comparative Example 1.

EXAMPLE 6

In the OLED display shown in FIG. 1 which is a section view, as the undercoat insulator 102, an SiN film was formed to be 10 nm thick, and the methyl isobutyl ketone application solution containing a hydrogen silsesquioxane compound as its chief component was then applied to the substrate. After that, by use of a hot plate heating system, the substrate was heated at 100° C. for 10 minutes, at 150° C.

for 10 minutes and at 230° C. for 10 minutes in an inert atmosphere such as a nitrogen atmosphere. After that, the substrate was heated at 350° C. for 30 minutes in an inert atmosphere such as a nitrogen atmosphere by use of a furnace casing heating system. Thus, Si—O—Si bonds were formed like a ladder structure, and finally formed into a porous insulating film containing SiO as its chief component.

On this occasion, the porous insulating film had the following properties.

Film Thickness: 140 nm, Density: 1.00 g/cm$^3$, Refractive Index: 1.29, Film Hardness: 0.27 GPa, Film Elasticity: 3.33 GPa, Average Nano Pore Diameter in Film: 1.3 nm, Maximum Nano Pore Diameter in Film: 0.55 nm An OLED display was manufactured in the same conditions as in Comparative Example 1, except the undercoat insulator 102. The OLED display was turned on in the same conditions as the OLED display in Comparative Example 1, and compared therewith as to the intensity of electroluminescence spectrum with respect to a visible light wavelength range, which was coupled out from G pixels to the transparent substrate side. Thus, there was obtained a result that the spectrum in Example 6 was about 1.2 times as intensive as that in Comparative Example 1.

EXAMPLE 7

On the substrate where the undercoat insulator 102 was formed in Example 6, the interlayer insulator 106 and the insulator 107 were formed in the same manner as in Example 5. Thus, an OLED display was manufactured. On this occasion, the porous insulating film containing SiO as its chief component ranged over the insulator 107, the interlayer insulator 106 and the undercoat insulator 102, and the total film thickness reached about 630 nm. The porous insulating film had the following properties.

Density: 1.12 g/cm$^3$, Refractive Index: 1.29, Film Hardness: 0.61 GPa, Film Elasticity: 9.17 GPa, Average Nano Pore Diameter in Film: 1.4 nm, Maximum Nano Pore Diameter in Film: 0.6 nm The OLED display was turned on in the same conditions as the OLED display in Comparative Example 1, and compared therewith as to the intensity of electroluminescence spectrum with respect to a visible light wavelength range, which was coupled out from G pixels to the transparent substrate side. Thus, there was obtained a result that the spectrum in Example 7 was about 1.3 times as intensive as that in Comparative Example 1.

EXAMPLE 8

Figure 2:
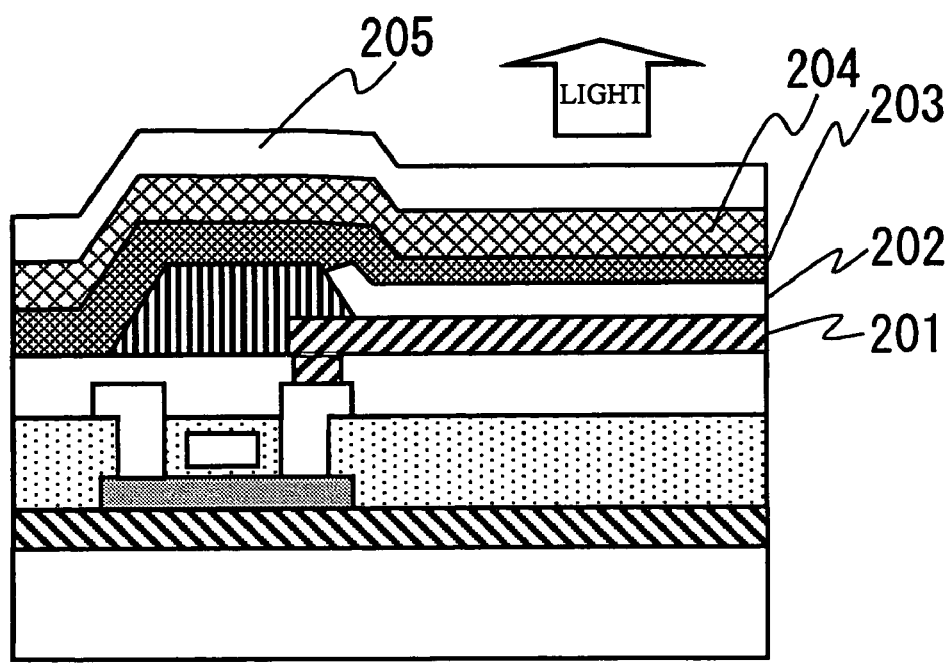
FIG. 2 is a sectional view for explaining an active matrix type OLED display serving as a top emission type device according to the present invention.

An OLED display having a structure shown in FIG. 2 was manufactured. The manufacturing method was as follows. In the same manner as in FIG. 1, an undercoat insulator was formed out of an SiN film 100 nm thick and an SiO film 50 nm thick thereon by a CVD method so as to have a total thickness of 150 nm on a substrate. An interlayer insulator was formed out of an SiO film 400 nm thick by use of a CVD method. A pixel separating insulator was formed out of an SiN film 150 nm thick by use of a CVD method.

Next, an Al electrode was formed as the organic electroluminescence electrode 201 also having a reflector layer for reflecting organic electroluminescence emission. Heating a boat was controlled so that the substrate temperature was the room temperature, the degree of vacuum was 10$^{-4}$ Pa, and the deposition rate was 0.1 to 1 nm/s. The film thickness was set at 150 nm.

Next, an electron injection layer, an emission and electron transport layer and a hole transport layer were formed sequentially and continuously. Thus, the organic electroluminescence layer 202 was formed. The electron injection layer was formed by deposition of LiF. Heating a boat was controlled so that the substrate temperature was the room temperature, the degree of vacuum was 10$^{-4}$ Pa, and the deposition rate was 0.1 to 1 nm/s. The film thickness was set at 0.5 nm.

The emission and electron transport layer was formed by vacuum deposition per pixel with tris (8-quinolinol)-aluminum complex derivatives and dopant materials corresponding to the three primary colors R, B and G by use of an mask for the evaporation. Heating an evaporation boat was controlled so that the substrate temperature was the room temperature, the degree of vacuum was 10$^{-4}$ Pa, and the deposition rate was 0.1 to 1 nm/s. The film thickness was set at 70 nm. In this example, a coumarin compound was used as the dopant for G pixels.

The hole transport layer was formed by vacuum deposition of diphenylnathtyldiamine. In this event, a mask for the evaporation was used only in a pixel portion, and heating an evaporation boat was controlled so that the substrate temperature was the room temperature, the degree of vacuum was 10$^{-4}$ Pa, and the deposition rate was 0.1 to 1 nm/s. The film thickness was set at 50 nm.

Next, indium oxide and zinc oxide were formed into a film as the transparent electrode 203 by use of an opposed target sputtering technique. Thus, the transparent electrode 203 was formed to be 100 nm thick.

Next, the methyl isobutyl ketone application solution containing a hydrogen silsesquioxane compound as its chief component, which solution was the same as that in Example 1, was applied to the substrate as the porous insulating film 204. After that, by use of a hot plate heating system, the substrate was heated at 100° C. for 1 minute, at 150° C. for 1 minute, at 200° C. for 1 minute and at 250° C. for 10 minutes in an inert atmosphere such as a nitrogen atmosphere. Thus, Si—O—Si bonds were formed like a ladder structure, and finally formed into a porous insulating film containing SiO as its chief component.

On this occasion, the porous insulating film had the following properties.

Film Thickness: 200 nm, Density: 1.12 g/cm$^3$, Refractive Index: 1.29, Film Hardness: 0.61 GPa, Film Elasticity: 9.17 GPa, Average Nano Pore Diameter in Film: 1.4 nm, Maximum Nano Pore Diameter in Film: 0.6 nm Next, an SiN film was formed to be 50 nm thick by a sputtering technique. Thus, the moisture barrier protective film 205 was produced.

COMPARATIVE EXAMPLE 3

Each layer up to the transparent electrode 203 was formed in the same manner as in Example 8. Next, an SiN film was formed to be 50 nm thick by a sputtering technique. Thus, the moisture barrier protective film 205 was produced. There was a difference from Example 8 in that the porous insulating film 204 was not formed.

An OLED display manufactured thus was turned on in the same conditions as in Example 8, and compared therewith as to the intensity of electroluminescence spectrum with respect to a visible light wavelength range, which was coupled out from G pixels to the transparent substrate side. Thus, there was obtained a result that the spectrum in Example 8 was about 1.3 times as intensive as that in Comparative Example 3.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications a fall within the ambit of the appended claims.

We claim:

1. An active matrix type organic light emitting diode display with thin film transistors formed therein, wherein a porous insulating film which is porous with nano pores in said film and contains SiO is formed between a transparent electrode contacting with an organic electroluminescence layer and a surface from which emission from said organic electroluminescence layer is coupled out to the outside, and said porous insulating film has a film density not lower than 0.6 g/cm$^3$ and lower than 1.8 g/cm$^3$ and a film refractive index lower than that of said transparent electrode.

2. An active matrix type organic light emitting diode display serving as a bottom emission type device for coupling out light on the side of a transparent substrate where thin film transistors are formed therein, wherein at least one of insulator layers formed between said transparent substrate and a transparent electrode contacting with an organic electroluminescence layers is formed out of a porous insulating film which is porous with nano pores in said film and contains SiO and which has a film density not lower than 0.6 g/cm$^3$ and lower than 1.8 g/cm$^3$ and a film refractive index lower than that of said transparent electrode.

3. An active matrix type organic light emitting diode display according to claim 1, wherein said porous insulating film contacts with said transparent electrode.

4. An active matrix type organic light emitting diode display according to claim 1, wherein said porous insulating film is lower in film refractive index than said transparent substrate.

5. An active matrix type organic light emitting diode display according to claim 1, wherein a main nano pore diameter in said porous insulating film is not shorter than 0.2 nm and not longer than 5.0 nm.

6. An active matrix type organic light emitting diode display according to claim 1, wherein an average nano pore diameter in said porous insulating film is not shorter than 0.6 nm and not longer than 3.0 nm.

7. An active matrix type organic light emitting diode display according to claim 1, wherein a maximum nano pore diameter in said porous insulating film is not shorter than 0.3 nm and shorter than 2.0 nm.

8. An active matrix type organic light emitting diode display according to claim 1, wherein a light transparency of said porous insulating film is not lower than 80% in a visible light wavelength range.

9. An active matrix type organic light emitting diode display according to claim 1, wherein said porous insulating film is an insulating film containing SiO and obtained by heating a coat film containing a hydrogen silsesquioxane compound or a methyl silsesquioxane compound as its chief component.

10. An active matrix type organic light emitting diode display according to claim 9, wherein said porous insulating film is an insulating film containing SiO and obtained by heating a coat film containing a hydrogen silsesquioxane compound or a methyl silsesquioxane compound as its chief component in a condition of a temperature not lower than 300° C. and not higher than 450° C.

11. An active matrix type organic light emitting diode display according to claim 1, wherein said porous insulating film is an insulating film containing SiO and formed by chemical vapor deposition reaction using source gas containing alkylsilane compounds or alkoxysilane compounds as its chief component.

12. An active matrix type organic light emitting diode display according to claim 11, wherein said porous insulating film is an insulating film containing SiO and obtained by forming a film by chemical vapor deposition reaction using source gas containing alkylsilane compounds or alkoxysilane compounds as its chief component and then heating said film in a condition of a temperature not lower than 300° C. and lower than 450° C.

13. An active matrix type organic light emitting diode display serving as a top emission type device for coupling out light in an opposite direction to a substrate where thin film transistors are formed, wherein a porous insulating film which is porous with nano pores in said film and contains SiO is formed between a transparent electrode contacting with an organic electroluminescence layer and a surface from which emission from said organic electroluminescence layer is coupled out to the outside, and said porous insulating film has a film density not lower than 0.6 g/cm$^3$ and lower than 1.8 g/cm$^3$ and a film refractive index lower than that of said transparent electrode.

14. An active matrix type organic light emitting diode display serving as a top emission type device for coupling out light in an opposite direction to a substrate where thin film transistors are formed, wherein a porous insulating film which is porous with nano pores in said film and contains SiO is formed between a transparent electrode contacting with an organic electroluminescence layer and a surface from which emission from said organic electroluminescence layer is coupled out to the outside, and said porous insulating film has a film density not lower than 0.6 g/cm$^3$ and lower than 1.8 g/cm$^3$ and a film refractive index lower than that of said transparent electrode, while a protective film preventing permeation of oxygen, having a light transparency of 80% or higher in a visible light wavelength range and having a moisture barrier property is formed on said porous insulating film.

15. An active matrix type organic light emitting diode display according to claim 14, wherein a refractive index of said porous insulating film is lower than that of said protective film.

16. An active type organic electroluminescence display according to claim 13, wherein a main nano pore diameter in said porous insulating film is not shorter than 0.2 nm and not longer than 5.0 nm.

17. An active matrix type organic light emitting diode display according to claim 13, wherein an average nano pore diameter in said porous insulating film is not shorter than 0.6 nm and not longer than 3.0 nm.

18. An active matrix type organic light emitting diode display according to claim 13, wherein a maximum nano pore diameter in said porous insulating film is not shorter than 0.3 nm and shorter than 2.0 nm.

19. An active matrix type organic light emitting diode display according to claim 13, wherein a light transparency of said porous insulating film is not lower than 80% in a visible light wavelength range.

20. An active matrix type organic light emitting diode display according to claim 13, wherein said porous insulating film is an insulating film containing SiO and obtained by heating a coat film containing a hydrogen silsesquioxane compound or a methyl silsesquioxane compound as its chief component.

21. An active matrix type organic light emitting diode display according to claim 13, wherein said porous insulating film is an insulating film containing SiO and obtained by forming a coat film containing a hydrogen silsesquioxane compound or a methyl silsesquioxane compound as its chief component and then heating said coat film in a condition of a temperature not higher than 250° C.

22. An active matrix type organic light emitting diode display according to claim 13, wherein said porous insulating film is an insulating film containing SiO and formed by chemical vapor deposition reaction using source gas containing alkylsilane compounds or alkoxysilane compounds as its chief component.

23. An active matrix type organic light emitting diode display according to claim 13, wherein said porous insulating film is an insulating film containing SiO and obtained by forming a film by chemical vapor deposition reaction using source gas containing alkylsilane compounds or alkoxysilane compounds as its chief component and then heating said film in a condition of a temperature not higher than 250° C.

* * * * *